US006736993B1

(12) United States Patent
Xu et al.

(10) Patent No.: US 6,736,993 B1
(45) Date of Patent: May 18, 2004

(54) SILICON REAGENTS AND LOW TEMPERATURE CVD METHOD OF FORMING SILICON-CONTAINING GATE DIELECTRIC MATERIALS USING SAME

(75) Inventors: Chongying Xu, New Milford, CT (US); Thomas H. Baum, New Fairfield, CT (US); Bryan C. Hendrix, Danbury, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 09/551,018

(22) Filed: Apr. 18, 2000

(51) Int. Cl.[7] .................................................. C09K 3/00
(52) U.S. Cl. .......................... 252/182.12; 252/182.11; 556/465; 556/487; 556/489
(58) Field of Search ................. 252/182.11, 182.12; 556/465, 487, 489

(56) References Cited

U.S. PATENT DOCUMENTS 4,147,556 A * 4/1979 Donley .................. 106/287.18
4,182,824 A * 1/1980 Suzuki et al. .................. 528/15

OTHER PUBLICATIONS

U.S. patent application Ser. No. 09/216,673, Stauf et al., filed Dec. 18, 1998.
U.S. patent application Ser. No. 08/484,654 Gardiner, filed Jun. 7, 1995.

* cited by examiner

Primary Examiner—Cephia D. Toomer
(74) Attorney, Agent, or Firm—William F. Ryann; Margaret Chappuis

(57) ABSTRACT

Silicon precursors for forming silicon films. Hexacoordinated silicon beta-diketonate compositions are described, of the formula $R_2Si(\text{-diketonate})_2$ or $(RO)_2Si(\beta\text{-diketonate})_2$, wherein each R is the same as or different from the other R, and each R is independently selected from H, aryl, fluoroaryl, $C_1$–$C_{12}$ alkyl, $C_1$–$C_{12}$ fluoroalkyl and $C_1$–$C_{12}$ silicon-containing alkyl. The precursors are compatible with dopant co-precursors such as transition metal β-diketonate coordination complexes. The compositions enable low temperature (e.g., <600° C.) formation of gate dielectrics, capacitor films, etc., in the fabrication of VLSI microelectronic devices.

14 Claims, 8 Drawing Sheets

SILICON REAGENTS AND LOW TEMPERATURE CVD METHOD OF FORMING SILICON-CONTAINING GATE DIELECTRIC MATERIALS USING SAME

BACKGROUND OF THE INVENTION

1. Field Of The Invention

The present invention relates to silicon reagents, as well as to a method of forming silicon-containing gate dielectric materials (e.g., silicon dioxide ($SiO_2$), silicates, etc.) and structures using such reagents. Description of the Related Art Silicon dioxide ($SiO_2$) films doped with early transition metal oxides, e.g., $ZrO_2$ or $HfO_2$, are of great interest for use as next generation gate dielectrics. These silicates provide higher dielectric constants (10–15) than conventional oxide-nitride-oxide stacks. Given the progressively decreasing feature sizes of VLSI devices, chemical vapor deposition (CVD) provides a superior technique for depositing gate dielectric films.

There are several issues associated with CVD of gate dielectrics.

Low temperature CVD silicon precursors are required. Ideally, the silicon precursor decomposes below 600° C., forming a silicon oxide film of high purity and high density characteristics.

Additionally, the silicon precursor must be compatible with the dopant reagents that are used to produce doped silicon dioxide films. These dopant reagents include metal (e.g., Zr, Hf, La, Ta, Y, Gd or other transition metal species) β-diketonate complexes such as $Zr(thd)_2(i-PrO)_2$.

Capacitors made with the current $SiO_2$ dielectrics are limited in capacitance as the film is made thinner, due to excessive leakage from tunneling. The best candidate higher dielectric constant materials for Si-based CMOS are silicate glasses modified by Zr, Hf, La or Y oxides, since such glasses are thermally stable in contact with silicon and have a low density of trapped charge at the interface.

Efforts to develop such capacitors have been limited by the absence of suitable precursors from which silicate glasses of such type can be formed.

Traditional precursors such as zirconium isopropoxide can be used to deposit $ZrO_2$, but when a traditional silicon precursor such as silane is added in the process, only a very narrow range of Si:Zr ratios can be grown as oxide glass, and associated gas phase reactions tend to form particles. Even with precursor molecules containing both Si and Zr, the Si:Zr ratio cannot easily be controlled.

The foregoing is complicated by the fact that an upper temperature limit of 650° C. is imposed by integration requirements and the objective of limiting thermal oxide growth.

Currently, most silicon precursors either do not decompose at required temperatures, or are not compatible with β-diketonate metal precursors.

Development of new silicon CVD precursors and compositions therefore is desirable.

SUMMARY OF THE INVENTION

The present invention relates to novel precursor compositions for low temperature (<600° C.) chemical vapor deposition (CVD) formation of silicon-containing films, and to associated methods of making and using such types of compositions.

While encompassing various aspects, as hereinafter more fully disclosed, one aspect of the invention relates to novel hexacoordinated silicon beta-diketonate compositions.

Compositions of such type include those of the formula $R_2Si(\beta\text{-diketonate})_2$ and $(RO)_2Si(\beta\text{-diketonate})_2$, wherein each R is the same as or different from the other R, and each R is independently selected from H, aryl, fluoroaryl, $C_1$–$C_{12}$ alkyl, and $C_1$–$C_{12}$ fluoroalkyl.

According to a further aspect, such compositions may be employed to form silicon-containing films of varying types, including doped silicon dioxide films (when a dopant co-precursor is utilized), by chemical vapor deposition (CVD) methodologies.

Yet another aspect of the invention relates to a process for forming a silicate film on a substrate, comprising chemical vapor deposition of the film using as the chemical vapor deposition precursor an alkoxide β-diketonate silicon precursor in combination with at least one of (a) and (b):

(a) an alkoxide β-diketonate precursor for one or more of Zr, Hf, Nb, and Ta, and (b) a β-diketonate precursor for one or more of Y, La, Sr and Ba.

Another aspect of the invention relates to a chemical vapor deposition precursor comprising an alkoxide β-diketonate silicon precursor in combination with at least one of (a) and (b):

(a) an alkoxide β-diketonate precursor for one or more of Zr, Hf, Nb, and Ta; and (b) a β-diketonate precursor for one or more of Y, La, Sr and Ba.

Other aspects, features and embodiments of the invention will be more fully apparent from the ensuing disclosure and appended claims.

DETAILED DESCRIPTION OF THE INVENTION AND PREFERRED EMBODIMENTS THEREOF

Figure 1:
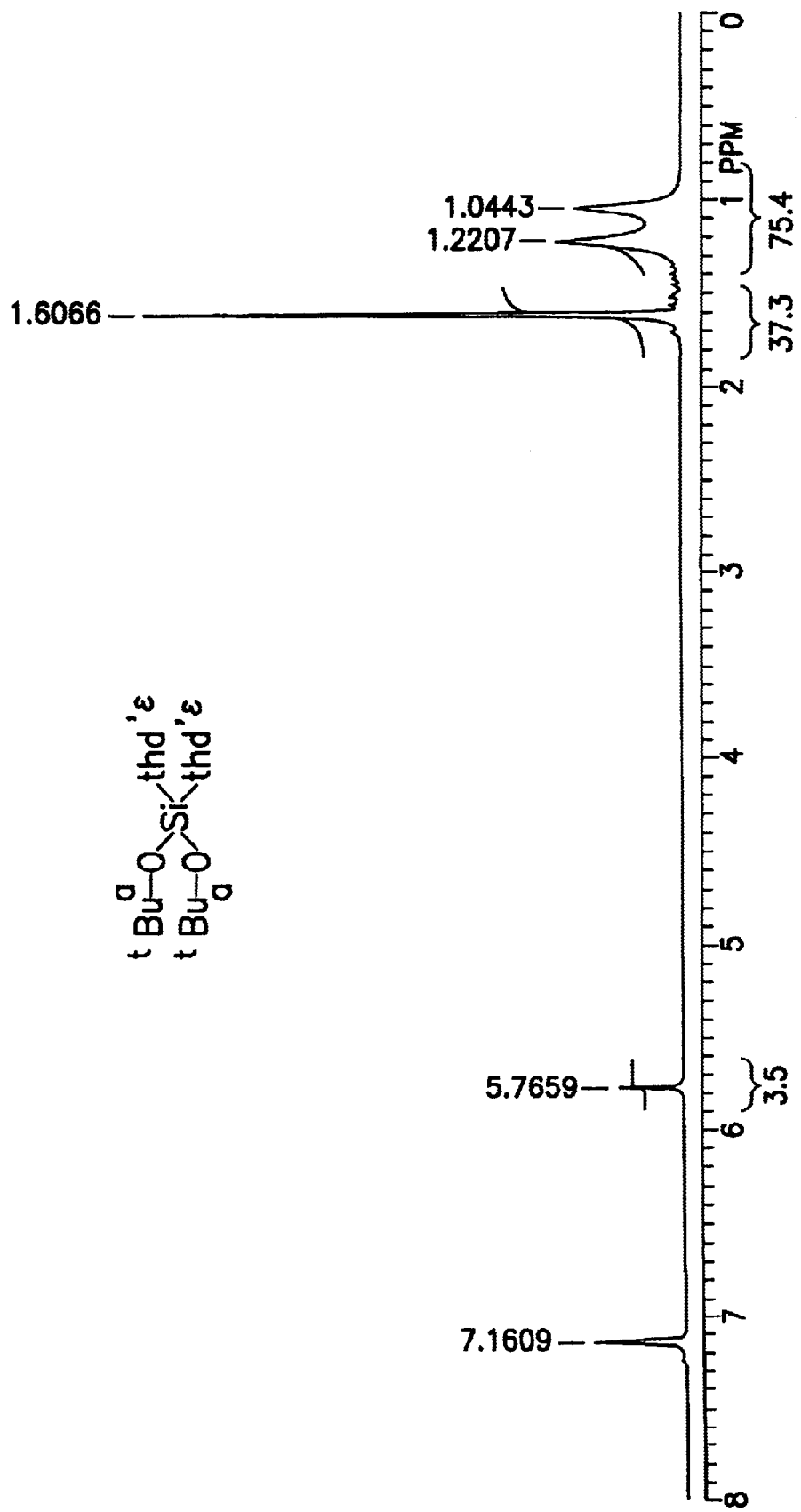
FIG. 1 is an $^1H$ NMR spectrum of $(t-BuO)_2Si(thd)_2$ in $C_6D_6$.

The silicon precursors of the present invention include hexacoordinated silicon beta-diketonate compositions of the formulae $R_2Si(\beta\text{-diketonate})_2$ and $(RO)_2Si(\beta\text{-diketonate})_2$ wherein each R is the same as or different from the other R, and each R is independently selected from H, aryl, fluoroaryl, $C_1$–$C_{12}$ alkyl, and $C_1$–$C_{12}$ fluoroalkyl.

The silicon precursors are useful as low temperature silicon CVD precursors. These precursors have applicability for forming gate dielectrics, low-k dielectrics, and silicon oxy-nitrides, and are compatible with metal β-diketonate co-reactants for the deposition of metal silicate films.

Hexacoordinated silicon precursors of the general formula $R_2Si(\beta\text{-diketonate})_2$ include those of the following structure:

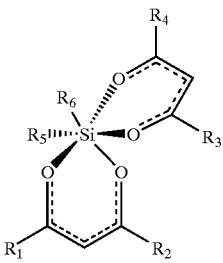

wherein:
$R_1$, $R_2$, $R_3$ and $R_4$ are the same as or different from one another, and wherein each of such substituents is independently selected from H, aryl, fluoroaryl, $C_1$–$C_{12}$ alkyl, and $C_1$–$C_{12}$ fluoroalkyl; and $R_5$ and $R_6$ are same as or different from one another, and each is independently selected from H, aryl, fluoroaryl, $C_1$–$C_{12}$ alkyl, $C_1$–$C_{12}$ fluoroalkyl, and silicon-containing $C_1$–$C_{12}$ alkyl (e.g., trialkylsilanes such as trimethylsilane).

Hexacoordinated silicon precursors of the general formula $(RO)_2Si(\beta\text{-diketonate})_2$ include those of the following structure:

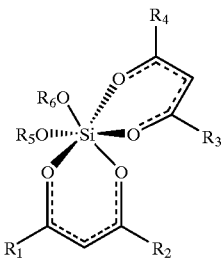

wherein:
$R_1$, $R_2$, $R_3$ and $R_4$ are the same as or different from one another, and wherein each of such substituents is independently selected from H, aryl, fluoroaryl, $C_1$–$C_{12}$ alkyl, and $C_1$–$C_{12}$ fluoroalkyl; and $R_5$ and $R_6$ are same as or different from one another, and each is independently selected from H, aryl, fluoroaryl, $C_1$–$C_{12}$ alkyl, $C_1$–$C_{12}$ fluoroalkyl and silicon-containing $C_1$–$C_{12}$ alkyl.

The aryl groups in the above-described substituents include $C_1$–$C_{12}$ aryl, e.g., phenyl, naphthyl, etc. Alkyl groups include methyl, ethyl, propyl, butyl, pentyl, hexyl, heptyl, octyl, and isomers thereof. The fluoroalkyl groups include corresponding alkyl groups substituted with fluorine substituents, e.g., trifluoromethyl, etc.

The above-described hexacoordinated silicon compositions are useful as low temperature CVD precursors for forming silicon dioxide films and other silicon-containing materials. They are compatible with transition metal β-diketonates, such as those of the formula $M(\beta\text{-diketonate})_{x8}(\text{alkoxide})_y$, wherein M is a transition metal, for example, Zr, Hf, Ti, Y, La, Ta, Gd, Er, etc., x is from about 1 to 4 and y is from about 0 to 2. Illustrative transition metal β-diketonate compositions include, without limitation, $Hf(thd)_2(i\text{-PrO})_2$, $Hf(thd)_2(t\text{-BuO})_2$, $Hf(thd)_4$, $Zr(thd)_2(i\text{-PrO}_2)_2$, $Zr(thd)_2(t\text{-BuO})_2$, $Zr(thd)_4$, $La(thd)_3$, $Y(thd)_3$, etc.

The β-diketonate ligands in the hexacoordinated silicon composition can be of any suitable type, including β-diketonate ligands such as 2,2,6,6-tetramethyl-3,5-heptanedionate, referred to as "thd," 1,1,1,2,2,3,3-heptafluoro-7,7-dimethyloctane-4,6-dionate, referred to as "fod," acetylacetonate, referred to as "acac" or "ac," trifluoroacetylacetonate, referred to as "tfacac" or "tfac," and hexafluoroacetylacetonate, referred to as "hfacac" or "hfac," etc. Each β-diketonate ligand of the composition may be the same as or different from the other β-diketonate ligand of the composition.

Hexacoordinated silicon compounds of different types can also be used in mixture with one another in specific end use applications.

By way of illustration, the synthesis and characterization of two representative compounds, $(t\text{-BuO})_2Si(thd)_2$ and $(CH_3)_2Si(thd)_2$, are described in the examples hereinafter set forth. Other silicon precursor compositions of the above-discussed formulae may be correspondingly synthesized.

The silicon precursors are useful for CVD of silicon dioxide. The precursor compositions in such application are dissolved in a suitable solvent. Examples include aliphatic hydrocarbons such as pentane, hexane, heptane, octane, nonane, decane, etc., cycloaliphatic hydrocarbons such as cyclopentane, cyclohexane, etc., aromatic hydrocarbons such as benzene, toluene, xylene, trimethylbenzene, tetramethylbenzene, ethylbenzene, cumene, etc., heterocyclic hydrocarbons such as tetrahydrofuran, furan, tetrahydrothiophene, pyrrole, pyridine, etc. Other solvent compositions useful in specific applications include solvents disclosed in U.S. patent application Ser. No. 09/216,673 filed Dec. 18, 1998 in the names of Gregory T. Stauf et al., and U.S. patent application Ser. No. 08/484,654 filed Jun. 7, 1995 in the names of Robin A. Gardiner, et al., now allowed, the disclosures of which hereby are incorporated herein by reference in their entireties.

Various other solvent species and solvent mixtures are alternatively useful, being readily identifiable by simple solubility, volatilization and CVD determinations for a given CVD application.

For CVD use, the precursor solution containing the silicon precursor and the solvent component(s) is vaporized to form a precursor vapor, and the vapor is contacted with a substrate at suitable CVD process conditions to deposit the desired silicon-containing film on the substrate.

The CVD process conditions illustratively can include an oxygen-containing environment, such as by separate introduction of oxygen or an oxygen-containing gas to the CVD chamber along with the silicon precursor vapor.

Alternatively, oxygen or an oxygen-containing gas can be provided in a carrier gas stream flowed through a vaporizer chamber in which the silicon precursor composition is vaporized to form the precursor vapor. By such arrangement, the precursor vapor is entrained in the carrier gas stream and transported as part of a resultant precursor feed stream to the CVD chamber for film deposition on the substrate therein.

The CVD process conditions can be readily determined by simple experiment within the skill of the art, to identify specific temperature, pressure, flow rate, compositions, etc. producing a specific or desired silicon dioxide film. Preferred CVD process conditions include temperature conditions for the chemical vapor deposition of less than about 600° C. and preferably less than 500° C.

The CVD process can be conducted with a co-reactant comprising a metal (β-diketonate) complex for doping the silicon-containing film with the metal or metal oxide of such metal (β-diketonate) coordination complex. The metal of such metal (β-diketonate) complex is a suitable dopant species, such as a transition metal, e.g., Zr, Hf or Ti. By such doping, the product silicon-containing film can be formed having a dielectric constant measured at 200° C. of above about 10.

The deposited silicon-containing film can form a doped or undoped silicon dioxide gate dielectric material in a microelectronic device structure. Alternatively, the silicon-containing film produced by the CVD method can be formed as a low dielectric film for inter-layer insulation of metal interconnects or for other applications, or a silicon oxynitride film when oxygen and nitrogen are incorporated in the product film.

As one embodiment of a film formation process according to a further aspect of the invention, alkoxide β-diketonate silicon precursors may be employed to form silicate films for capacitor fabrication. In such process, the silicate film is formed on the substrate by chemical vapor deposition, using as the chemical vapor deposition precursor an alkoxide β-diketonate silicon precursor in combination with at least one of (a) and (b):

(a) an alkoxide β-diketonate precursor for one or more of Zr, Hf, Nb, and Ta; and (b) a β-diketonate precursor for one or more of Y, La, Sr and Ba.

The alkoxide β-diketonate silicon precursor can be of any suitable type, e.g bis(t-butoxy) bis (tetramethylheptanedionato)silane. The alkoxide β-diketonate silicon precursors are chemically compatible with the β-diketonate precursors (a) and (b). The alkoxide β-diketonate silicon precursors therefore can be stored in solution form with the β-diketonate precursors (a) and (b), and can be vaporized and transported with such other precursors to form modified silicate glasses for Si-based CMOS capacitors.

It will be appreciated that the silicon-containing product film can be formed with other precursors or gaseous/vapor phase components to form a wide variety of silicon-containing films having correspondingly varied chemical makeup, as regards the stoichiometry and elemental components of the film.

It will be further appreciated that although the present invention is directed primarily to precursor compositions for chemical vapor deposition, the CVD precursors described herein may be modified by increasing the carbon number of the hydrocarbyl substituents thereof. For example, the "R" groups, $R_1-R_6$, in the previously described Si β-diketonate compositions can be increased in carbon number, e.g., to $C_{13}-C_{20}$ alkyl or $C_{13}-C_{20}$ fluoroalkyl, and/or higher carbon numbered alkyl groups can be employed in alkylsilane substituent "R" groups in such compositions, to produce modified compositions that are highly suitable for spin-on coating.

The features and advantages of the invention are more fully shown with reference to the following non-limiting examples.

EXAMPLE 1

Synthesis and Characterization of $(t-BuO)_2Si(thd)_2$

The general reactions were carried out under a steady flow of nitrogen. A 250 mL Schlenk flask was charged with 5.0 g of $(t-BuO)_2SiCl_2$, 50 mL of dry THF and a magnetic stirring bar. Next, 8.5 g of Na(thd) in 100 mL of THF was added into the Schlenk flask slowly at 0° C., under magnetic stirring. Upon completion of the addition, the mixture was slightly cloudy. The mixture was refluxed for 100 hours and white precipitate was observed. The reaction was stopped, and the mixture was filtered through Celite® filtration medium. A slightly yellow colored solution was obtained. Removal of volatiles under vacuum gave 9.7 grams of white solid product (yield 88%). The white product was characterized by solution NMR in $C_6D_6$, producing the $^1H$ NMR spectrum shown in FIG. 1. M.p.: 226° C.; $^1H$ NMR ($C_6D_6$), δ(ppm), 5.78 (s, 2H, 2×C$\underline{H}$ of thd), 1.61 (s, 18H, 2×—OC(C$\underline{H}_3)_3$), 1.22 and 1.04 (broad, 36H, 12×C$\underline{H}_3$ of thd).

The $^1H$ NMR spectrum clearly shows that the t-butyl groups cannot rotate freely in solution at 23° C. because of the sterically bulky t-butyl groups and the six-coordinate silicon central atom. The steric effects cause the protons of methyl groups to be magnetically inequivalent. Two sets of protons were observed in the NMR spectrum at room temperature at the high field; normally a single NMR resonance would be observed if the rotation was sterically facile and the butoxy groups were equivalent.

Figure 2:
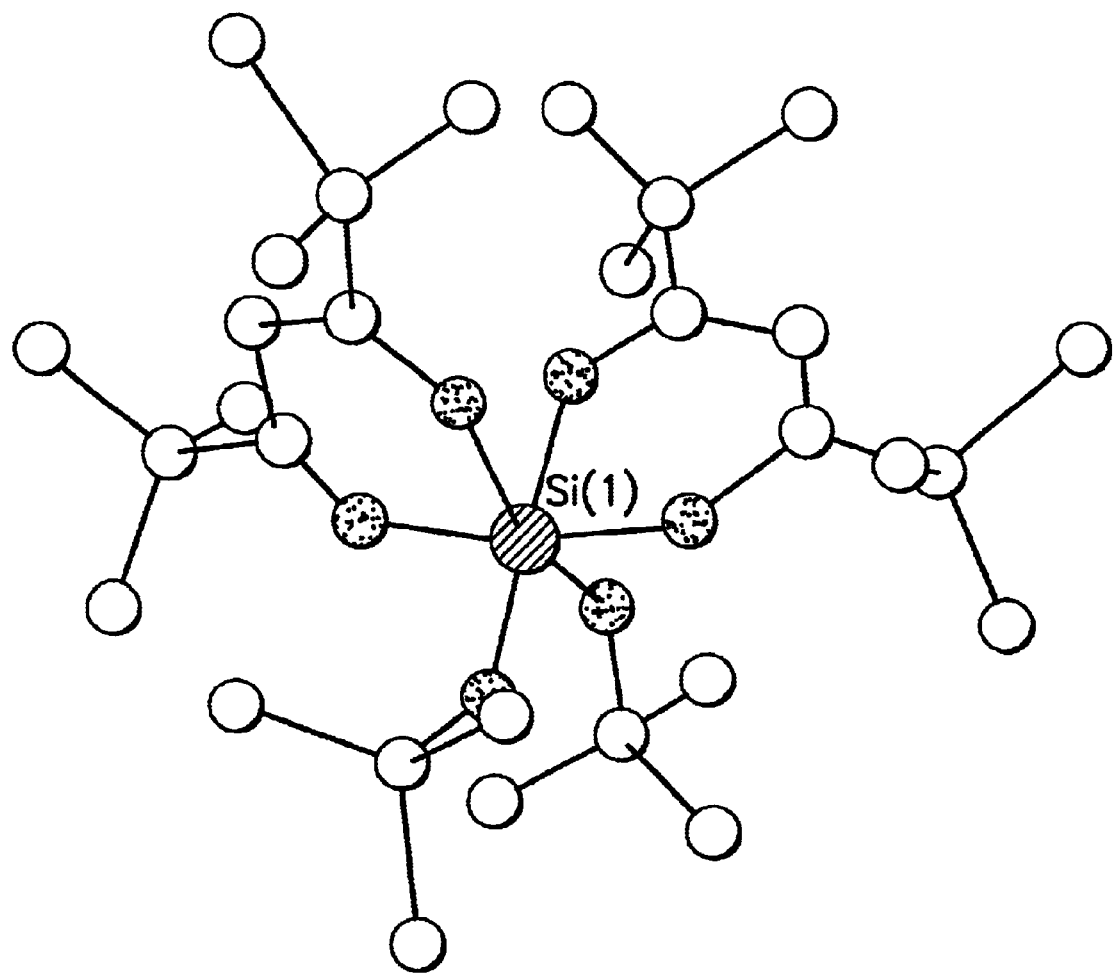
FIG. 2 is a representation of the molecular structure of $(t-BuO)_2Si(thd)_2$.

Single crystals of $(t-BuO)_2Si(thd)_2$ were grown from a pentane solution. Single crystal X-ray diffraction revealed that the Si in the composition was six-coordinated and six t-Bu groups in the coordinated complex were severely disordered, with a high R value of 27%. FIG. 2 is a representation of the molecular structure of $(t-BuO)_2Si(thd)_2$ based on the x-ray analysis.

Figure 3:
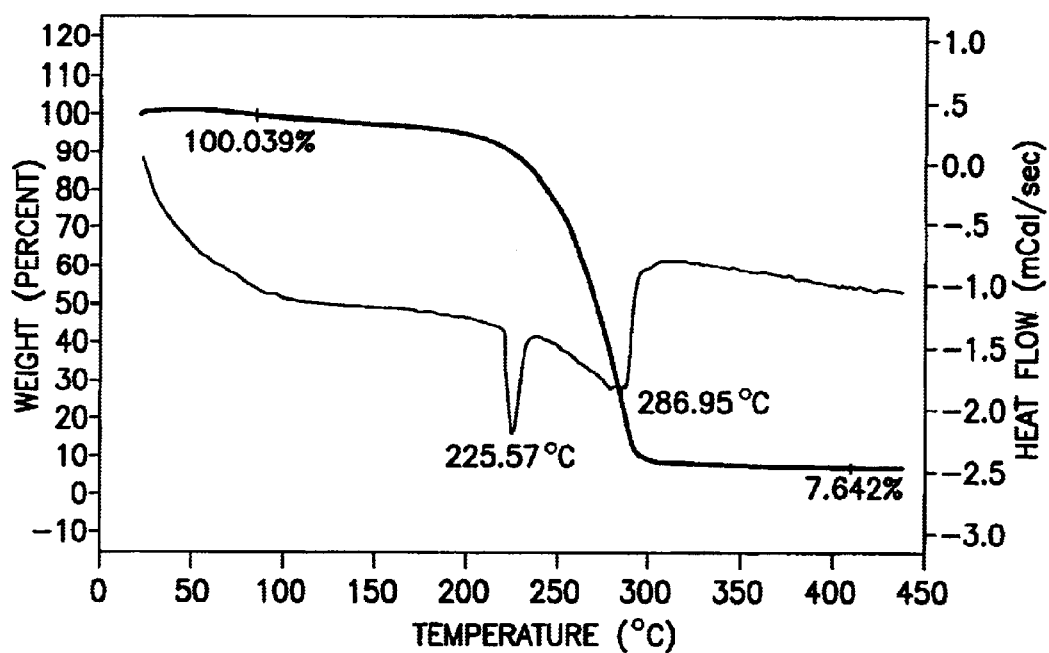
FIG. 3 is an STA spectrum of $(t-BuO)_2Si(thd)_2$.

The $(t-BuO)_2Si(thd)_2$ product was analyzed by thermal analysis. The STA data are shown in FIG. 3. A melting endothermic peak was observed at 226° C., and transport started around 200° C. at atmospheric pressure. The majority of the precursor was transported leaving only a small residue.

EXAMPLE 2

Synthesis and Characterization of $(CH_3)_2Si(thd)_2$

The general reactions were carried out under a steady flow of nitrogen. A 500 mL Schlenk flask was charged with 5 g of $(CH_3)_2SiCl_2$ in 50 mL of dry ether and a stir bar. Next 15.9 g of Na(thd) in 200 mL of dry ether was added into the Schlenk flask slowly at 0° C., under magnetic stirring. The mixture immediately became cloudy. The mixture was refluxed for two days and white precipitation was observed. The reaction mixture was filtered through Celite® filtration medium to obtain a slightly yellow colored clear solution. Removal of volatiles under vacuum gave crystalline solid product in high yield.

The solid product was characterized by solution NMR. M.p.: 94° C. $^1H$ NMR ($C_6D_6$), δ(ppm), 5.69 (s, 2H, 2×C$\underline{H}$ of thd), 1.10 (s, 36H, 12×C$\underline{H}_3$ in thd) and 0.66 (s, 6H, 2×Si—C$\underline{H}_3$).

Figure 4:
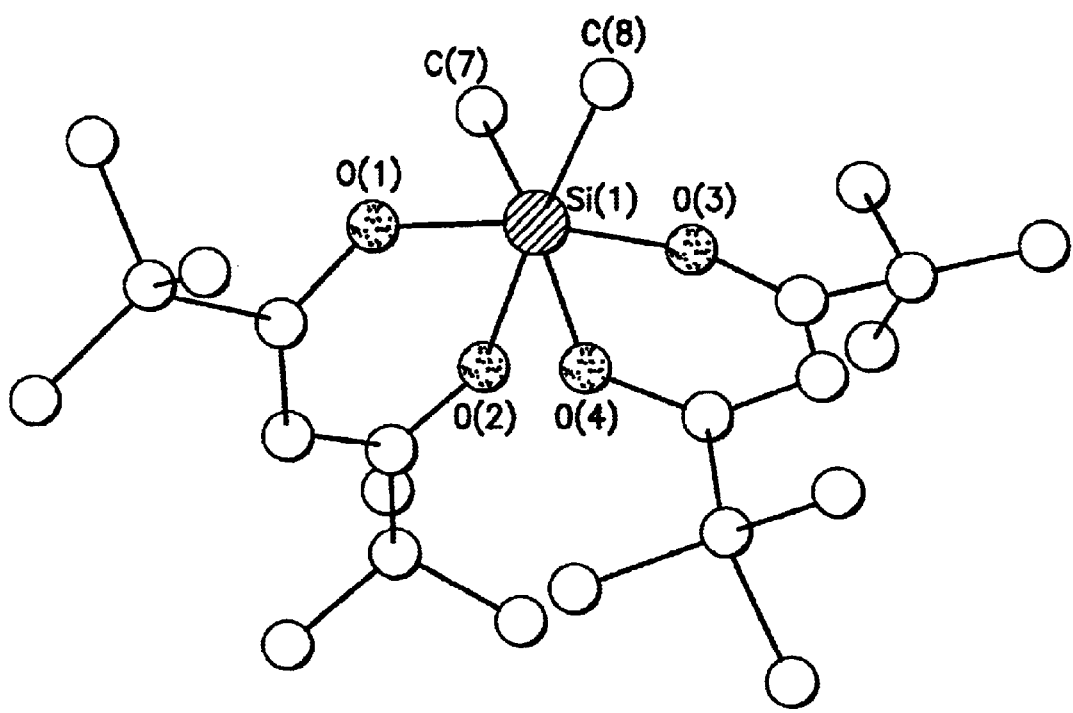
FIG. 4 is a representation of the molecular structure of $(CH_3)_2Si(thd)_2$.

Single crystals of $(CH_3)_2Si(thd)_2$ were grown from an anhydrous pentane solution. Single crystal x-ray diffraction showed that the Si central atom has octahedral coordination geometry. The molecular structure of $(CH_3)_2Si(thd)_2$ is shown in FIG. 4. This is a neutral Si β-diketonate compound having a six-coordinate silicon nuclear atom.

Figure 5:
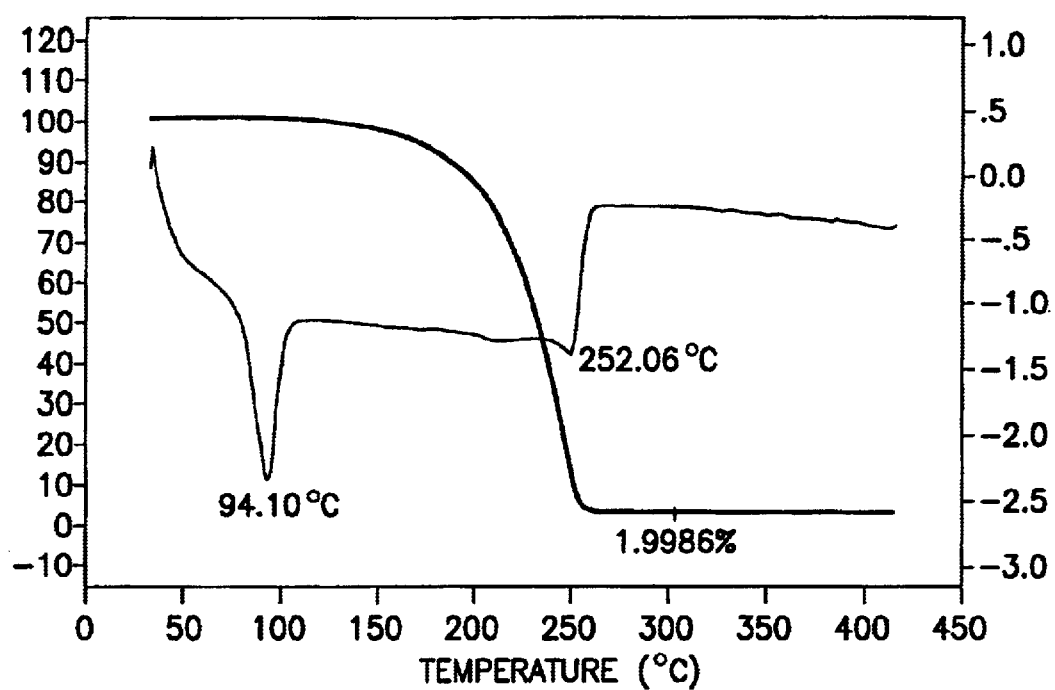
FIG. 5 is an STA spectrum of $(CH_3)_2Si(thd)_2$.

The product $(CH_3)_2Si(thd)_2$ also was analyzed by thermal analysis. The STA data are shown in FIG. 5. A melting endothermic peak was observed at 94° C. and transport started at 150° C. at atmospheric pressure, leaving only a small amount of residue.

EXAMPLE 3

Compatibility Studies $(i-PrO)_2Zr(thd)_2$ and $(t-BuO)_2Si(thd)_2$ were mixed in $C_6D_6$ in 1:1 molar ratio under nitrogen protection. The initial solution was clear. After 60 hours at room temperature, no reactions were observed visually and no reactions were determined to have occurred from $^1$H NMR studies that were conducted.

The $C_6D_6$ solution of $(i\text{-PrO})_2Zr(thd)_2$ and $(t\text{-BuO})_2Si(thd)_2$ was then heated in an oil bath maintained at a temperature of 90° C. The boiling point of $C_6D_6$ is 79.1° C. After the solution was heated to 90° C. in the oil bath and maintained thereafter at that temperature for 22 hours, no reactions were observed visually and no reactions were determined to have occurred from $^1$H NMR studies that were conducted.

Figure 6:
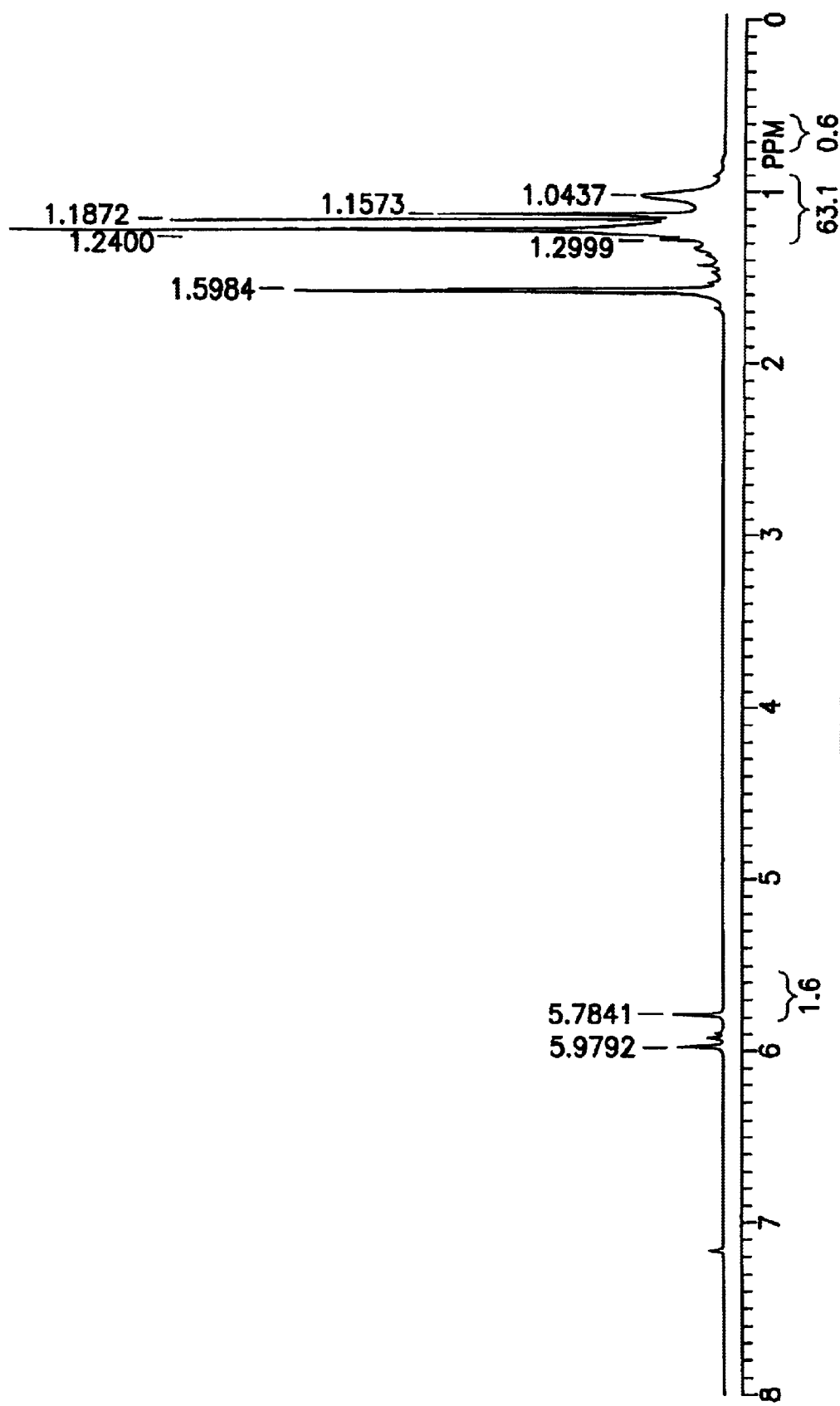
FIG. 6 is an $^1H$ NMR spectrum after mixing $(t-BuO)_2Si(thd)_2$ and $Zr(thd)_2(i-PrO)_2$ in $C_6D_6$.

FIG. 6 is an $^1$H NMR spectrum after mixing $(t\text{-BuO})_2Si(thd)_2$ and $Zr(thd)_2(i\text{-PrO})_2$ in $C_6D_6$ in a 1:1 molar ratio after 22 hours heating in the oil bath at ~90° C.

EXAMPLE 4

Figure 7:
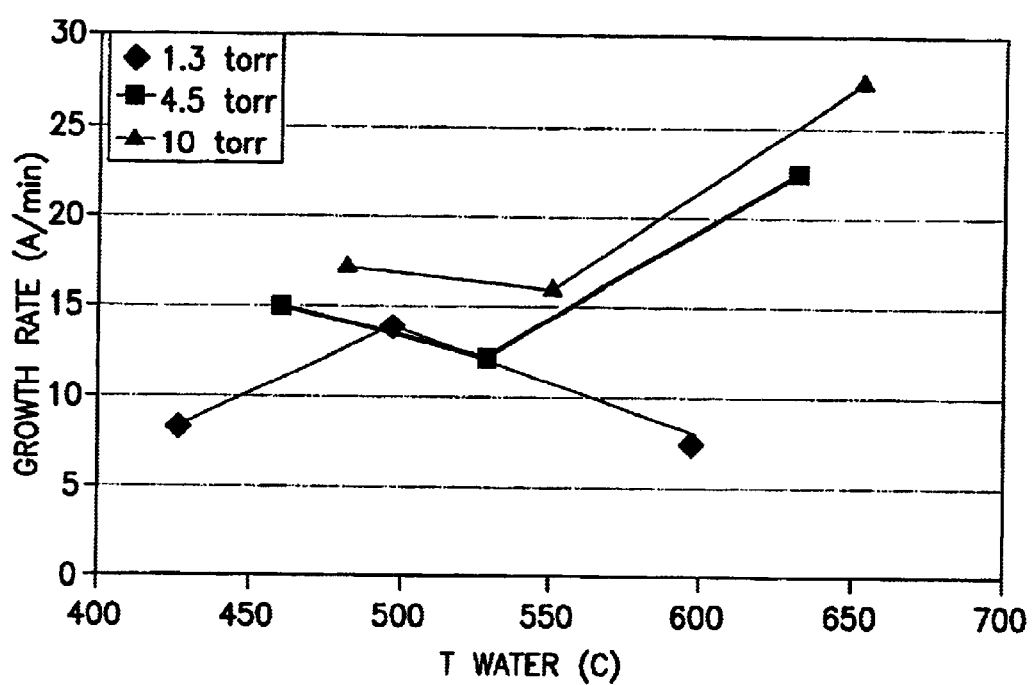
FIG. 7 is a graph of growth rate of $SiO_2$ films from $(t-BuO)_2Si(thd)_2$ at 1.3 torr, 4.5 torr and 10 torr in an oxidizing environment.
Figure 8:
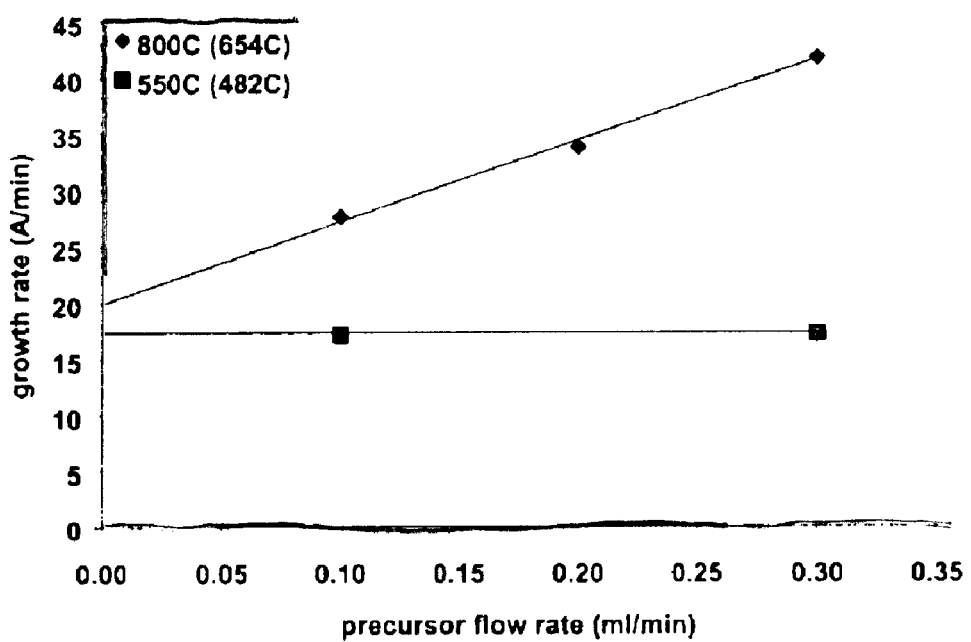
FIG. 8 is a graph of growth rate of $SiO_2$ films from $(t-BuO)_2Si(thd)_2$ as a function of precursor flow rate at 10 torr reactor pressure, at 482° C. and 654° C.

Silicon dioxide films were grown using $(t\text{-BuO})_2Si(thd)_2$, e.g. bis(t-butoxy) bis(tetramethylheptanedionato)silane, hereafter referred to as DBDTS. The generic process conditions are listed in Table A below. The growth rate of silicon dioxide films from DBDTS at 0.1 ml/min. is shown as a function of wafer surface temperature (calibrated using a thermocouple embedded in the surface of a bare Si wafer) in FIG. 7. The growth rate as a function of precursor delivery rate is shown in FIG. 8 for 10 torr processes at 650° C. (800° C. susceptor) and 480° C. (550° C. susceptor).

TABLE A

| Process Conditions | |
|---|---|
| Precursor solution | 0.10 M DBDTS in octane |
| Precursor solution delivery rate | 0.10–0.30 ml/min |
| Vaporization temperature | 190° C. |
| Run time | 25 minutes |
| Carrier gas | 100 sccm Ar |
| Heating and cooling process gas | 800 sccm Ar |
| Run time process gas | 700 sccm $O_2$ |
| Pressure | 1.3–10 torr |
| Susceptor temperature | 550–800° C. |

From FIG. 8, it can be seen that the growth is surface reaction limited at 480° C. and approaches mass transport limited character at 650° C. However, the growth rate is not very sensitive to substrate temperature from 450–550° C. The growth rates of 25–45 Å/min at 650° C. that were demonstrated in this empirical work are suitable for commercial manufacture of gate dielectric materials.

Although the invention has been variously disclosed herein with reference to illustrative aspects, embodiments and features, it will be appreciated that the aspects, embodiments and features described hereinabove are not intended to limit the invention, and that other variations, modification and other embodiments will suggest themselves to those of ordinary skill in the art. The invention therefore is to be broadly construed, consistent with the claims hereafter set forth.

What is claimed is:

1. A CVD precursor solution including a solvent component and a hexacoordinated silicon betamiketonate composition of the formula $R_2Si(\beta\text{-diketonate})_2$ or $(RO)_2Si(\beta\text{-diketonate})_2$, wherein each R is the same as or different from the other R, and each R is independently selected from H, aryl, fluoroaryl, $C_1$–$C_{12}$ alkyl, $C_1$–$C_{12}$ fluoroalkyl, and $C_1$–$C_{12}$ silicon-containing alkyl.

2. The precursor solution of claim 1, wherein each β-diketonate ligand of the composition may be the same as or different from the other β-diketonate ligand of the composition, and is independently selected from: 2,2,6,6-tetramethyl-3,5-heptanedionate; 1,1,1,2,2,3,3-hepta-fluoro-7,7-dimethyloctane-4,6-dionate; acetylacetonate; trifluoroacetylacetonate; and hexafluoroacetylacetonate.

3. The precursor solution of claim 1, wherein each β-diketonate ligand of the composition is 2,2,6,6-tetramethyl-3,5-heptanedionate.

4. The precursor solution of claim 1, wherein the composition is of the formula $R_2Si(\beta\text{-diketonate})_2$.

5. The precursor solution of claim 1, wherein the composition is of the formula $(RO)_2Si(\beta\text{-diketonate})_2$.

6. The precursor solution of claim 1, wherein the composition is of the formula $(t\text{-BuO})_2Si(2,2,6,6\text{-tetramethyl-3,5-heptanedionate})_2$.

7. The precursor solution of claim 1, wherein the composition is of the formula $(CH3)_2Si(2,2,6,6\text{-tetramethyl-3,5-heptanedionate})_2$.

8. The precursor solution of claim 1, wherein said solvent component comprises a hydrocarbon solvent.

9. The precursor solution of claim 1, wherein said solvent component comprises octane.

10. A precursor solution for use in chemical vapor deposition, comprising a solvent component and a silicon β-diketonate of the formula:

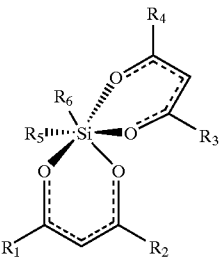

wherein:

$R_1$, $R_2$, $R_3$ and $R_4$ are the same as or different from one another, and wherein each of such substituents is independently selected from H, aryl, fluoroaryl, $C_1$–$C_{12}$ alkyl, $C_1$–$C_{12}$ fluoroalkyl, and $C_1$–$C_{12}$ silicon-containing alkyl; and $R_5$ and $R_6$ are same as or different from one another, and each is independently selected from H, aryl, fluoroaryl, $C_1$–$C_{12}$ alkyl, $C_1$–$C_{12}$ fluoroalkyl, and $C_1$–$C_{12}$ silicon-containing alkyl.

11. A precursor solution for use in chemical vapor deposition, comprising a solvent component and a silicon β-diketonate of the formula:

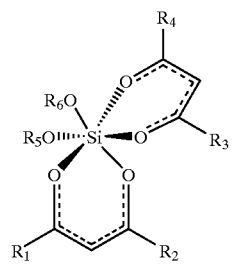

wherein:

$R_1$, $R_2$, $R_3$ and $R_4$ are the same as or different from one another, and wherein each of such substituents is independently selected from H, aryl, fluoroaryl, $C_1$–$C_{12}$ alkyl, $C_1$–$C_{12}$ fluoroalkyl and $C_1$–$C_{12}$ silicon-containing alkyl; and $R_5$ and $R_6$ are same as or different from one another, and each is independently selected from H, aryl, fluoroaryl, $C_1$–$C_{12}$ alkyl, $C_1$–$C_{12}$ fluoroalkyl, and $C_1$–$C_{12}$ silicon-containing alkyl.

12. A novel composition having the formula $(t\text{-OBu})_2\text{Si}(\text{thd})_2$.

13. A novel composition having the formula $(CH_3)_2\text{Si}(\text{thd})_2$.

14. A CVD precursor solution including a solvent component and a hexacoordinated silicon beta-diketonate composition of the formula $R_2\text{Si}(\beta\text{-diketonate})_2$ or $(RO)_2\text{Si}(\beta\text{-diketonate})_2$, wherein each R is the same as or different from the other R, and each R is independently selected from H, aryl, fluoroaryl, $C_1$–$C_{12}$ alkyl, $C_1$–$C_{12}$ fluoroalkyl, and $C_1$–$C_{12}$ silicon-containing alkyl, wherein said solvent component comprises octane.

* * * * *